United States Patent
Zhang et al.

(10) Patent No.: US 10,005,675 B2
(45) Date of Patent: Jun. 26, 2018

(54) LI4SR(BO3)2 COMPOUND, LI4SR(BO3)2 NONLINEAR OPTICAL CRYSTAL, PREPARATION METHOD AND USE THEREOF

(71) Applicants: Technical Institute of Physics and Chemistry, Chinese Academy of Sciences, Beijing (CN); Fujian Institute of Research on the Structure of Matter, Chinese Academy of Sciences, Fuzhou, Fujian (CN)

(72) Inventors: Guochun Zhang, Beijing (CN); Junhua Luo, Fujian (CN); Mingjun Xia, Beijing (CN); Sangen Zhao, Fujian (CN); Yicheng Wu, Beijing (CN)

(73) Assignees: ECHNICAL INSTITUTE OF PHYSICS AND CHEMISTRY, CHINESE ACADEMY OF SCIENCES, Beijing (CN); FUJIAN INSITUTE OF RESEARCH ON THE STRUCTURE OF MATTER, CHINESE ACADEMY OF SCIENCES, Fuzhou, Fujian (CN)

( * ) Notice: Subject to any disclaimer, the term of this patent is extended or adjusted under 35 U.S.C. 154(b) by 257 days.

(21) Appl. No.: 14/900,016

(22) PCT Filed: Jun. 20, 2013

(86) PCT No.: PCT/CN2013/077606
§ 371 (c)(1),
(2) Date: Dec. 18, 2015

(87) PCT Pub. No.: WO2014/201672
PCT Pub. Date: Dec. 24, 2014

(65) Prior Publication Data
US 2016/0137515 A1 May 19, 2016

(51) Int. Cl.
C30B 29/22 (2006.01)
C01B 35/12 (2006.01)
(Continued)

(52) U.S. Cl.
CPC .............. *C01B 35/128* (2013.01); *C30B 9/06* (2013.01); *C30B 9/12* (2013.01); *C30B 19/02* (2013.01);
(Continued)

(58) Field of Classification Search
CPC .......... C30B 15/00; C30B 13/00; C30B 29/22
See application file for complete search history.

(56) References Cited

FOREIGN PATENT DOCUMENTS

| CN | 1473967 A | 2/2004 |
|---|---|---|
| CN | 103031606 A | 4/2013 |
| JP | H5-139813 A | 6/1993 |

OTHER PUBLICATIONS

Diaz, A. et al.; "Red, Green, and Blue Eu2+ Luminescence in Solid-State Borates: A Structure-Property Relationship"; Materials Research Bulletin, vol. 31, No. 2, Dec. 1996 (Dec. 1, 1996), pp. 147-151.

(Continued)

*Primary Examiner* — Robert M Kunemund
(74) *Attorney, Agent, or Firm* — Novick, Kim & Lee, PLLC; Allen Xue

(57) ABSTRACT

The present invention relates to the field of nonlinear optical crystal materials and provided herein a $Li_4Sr(BO_3)_2$ compound, a $Li_4Sr(BO_3)_2$ nonlinear optical crystal as well as preparation method and use thereof. The $Li_4Sr(BO_3)_2$ nonlinear optical crystal has a second harmonic conversion efficiency at 1064 nm of about two times that of a $KH_2PO_4$ (KDP) crystal, and an UV absorption cut-off edge less than 190 nm. Furthermore, the crystal did not disintegrate. By flux method with $Li_2O$, $Li_2O$—$B_2O$ and $Li_2O$—$B_2O_3$—LiF (Continued)

used as flux agent, large-size and transparent $Li_4Sr(BO_3)_2$ nonlinear optical crystal can grow. The $Li_4Sr(BO_3)_2$ crystal had stable physicochemical properties, moderate hardness, and was easy to cut, processing, preserve and use. Therefore it can be used for preparing nonlinear optical devices and thus for developing nonlinear optical applications in the ultraviolet and deep-ultraviolet band.

16 Claims, 3 Drawing Sheets

(51) Int. Cl.
  *C30B 29/10* (2006.01)
  *C30B 19/02* (2006.01)
  *C30B 19/06* (2006.01)
  *C30B 33/02* (2006.01)
  *C30B 9/06* (2006.01)
  *C30B 9/12* (2006.01)
  *C30B 19/04* (2006.01)
(52) U.S. Cl.
  CPC ............ *C30B 19/04* (2013.01); *C30B 19/062* (2013.01); *C30B 29/10* (2013.01); *C30B 29/22* (2013.01); *C30B 33/02* (2013.01)

(56) References Cited

OTHER PUBLICATIONS

Zhang, M. et al; "Li2Sr4B12O23: A New Alkali and Alkaline-Earth Metalmixed Borate with [B10O18]6 Network and Isolated [B2O5]4 Unit"; Journal Ofsolid State Chemistry, vol. 190, Feb. 15, 2012 (Feb. 15, 2012), pp. 92-97.

US 10,005,675 B2

LI4SR(BO3)2 COMPOUND, LI4SR(BO3)2 NONLINEAR OPTICAL CRYSTAL, PREPARATION METHOD AND USE THEREOF

TECHNICAL FIELD

The present invention relates to a $Li_4Sr(BO_3)_2$ compound, a $Li_4Sr(BO_3)_2$ nonlinear optical crystal, the preparation method thereof and its use in preparing nonlinear optical devices.

BACKGROUND ART

Nonlinear optical effect of crystals is such an effect: when a beam of laser having a certain polarization direction passes through a nonlinear optical crystal in a direction, the frequency of the laser will change. Crystals having the nonlinear optical effect are referred as nonlinear optical crystals. The nonlinear optical effect of crystals can be used to produce nonlinear optical devices such as second harmonic generators, up/down frequency converters, optical parametric oscillators. All-solid-state laser using the nonlinear optical crystals in frequency conversion is a future developing direction of laser, in which the key issue is to obtain excellent nonlinear optical crystals.

Currently, the nonlinear optical crystals which can be applied in ultraviolet (UV) band mainly include $\beta$-$BaB_2O_4$ (BBO), $LiB_3O_5$ (LBO), $CsLiB_6O_{10}$ (CLBO) and $K_2Be_2BO_3F_2$ (KBBF), etc., but they each have disadvantages respectively. For example, LBO has a relatively low birefringence and therefore cannot realize a fourth harmonic generation output of 1064 nm laser. BBO has a relatively high birefringence. When BBO is used in the fourth harmonic generation output of 1064 nm, it would lead to a photorefractive effect which can limit the output power and beam quality thereof. Moreover, CLBO is highly deliquescent and thus its commercial application is hard to be realized. As to KBBF, it is difficult to obtain a crystal having a large thickness in c-direction due to its severe laminar growth habit. Therefore, it is urgent and necessary to explore new ultraviolet nonlinear optical crystals with excellent comprehensive properties.

According to anionic group theory, $(BO_3)^{3-}$ groups containing a conjugated $\pi$ bond have a microscopic second harmonic generation (SHG) coefficient. When these $(BO_3)^{3-}$ groups are arranged in a consistent direction, they can produce a high macroscopic SHG coefficient. Meanwhile, their planar configuration is favorable for producing relatively high birefringence to achieve phase-matching in UV band. Moreover, the $(BO_3)^{3-}$ groups having relatively wide band gap, which favors the transmission of UV and the increase of laser induced damage threshold. Therefore, the $(BO_3)^{3-}$ group is considered to be one of best groups for designing and synthesizing UV and deep UV nonlinear optical crystals. At present, KBBF crystal, of which the fundamental structural unit is $(BO_3)^{3-}$ group, is the only one that can produce direct secondary harmonic output of deep-UV laser. In the structure of KBBF crystal, the planar layers constructed by the $(BO_3)^{3-}$ and $(BeO_3F)^{5-}$ groups are connected together via $K^+$—$F^-$ ionic bond. Due to the weak interaction of the ionic bond, KBBF crystal exhibits severe laminar growth habit.

Therefore, the inventor designed to synthesize a new UV nonlinear optical material. In the material, the $(BO_3)^{3-}$ group serves as not only the fundamental structural unit of the planar layers, but also the connection media between the planar layers. Thus, on one hand, because the density of the $(BO_3)^{3-}$ groups increases, the obtained new material is possible to possess higher frequency doubling effect and higher birefringence; on the other hand, Because the layers depend on the $(BO_3)^{3-}$ groups as the connection media to each other, they can be connected more tightly, thereby the new material may not have laminar growth habit. The inventors have completed the present invention based on such findings and a lot of researches. The design is feasible proved by crystal structure analysis and powder SHG test, etc.

DETAILED DESCRIPTION OF THE INVENTION

An object of the invention is to provide a compound having a chemical formula of $Li_4Sr(BO_3)_2$.

An object of the invention is to provide a $Li_4Sr(BO_3)_2$ nonlinear optical crystal.

An object of the invention is to provide a preparation method of the $Li_4Sr(BO_3)_2$ crystal.

An object of the invention is to provide use of the $Li_4Sr(BO_3)_2$ nonlinear optical crystal.

The technical solutions according to the invention are described as follows:

(1) A compound having the chemical formula of $Li_4Sr(BO_3)_2$.

(2) A nonlinear optical crystal having the chemical formula of $Li_4Sr(BO_3)_2$, wherein the crystal does not contain symmetric center and belongs to monoclinic space group $C_c$ with lattice parameters of $\alpha=9.117(5)$ Å, $b=5.239(2)$ Å, $c=11.762(6)$ Å, $\beta=105.22(1)°$, $V=542.08$ (127) Å$^3$, and $Z=4$.

(3) A preparation method of the $Li_4Sr(BO_3)_2$ nonlinear optical crystal, wherein the growth of the $Li_4Sr(BO_3)_2$ nonlinear optical crystal is carried out by flux method, and the flux agent is selected from $Li_2O$, $Li_2O$—$B_2O_3$ or $Li_2O$—$B_2O_3$—LiF.

(4) The preparation method according to (3), which comprises the following steps:

$Li_2O$, SrO and $B_2O_3$, with a molar ratio of 4-8:1:1-3 (equivalent to a molar ratio of $Li_4Sr(BO_3)_2$:$Li_2O$:$B_2O_3$=1:2-6:0-2) (preferably 4-7:1:1-2), or $Li_2O$, SrO, $B_2O_3$ and LiF, with a molar ratio of 4-8:1:1-3:1-3 (equivalent to a molar ratio, $Li_4Sr(BO_3)_2$:$Li_2O$:$B_2O_3$:LiF=1:2-6:0-2:1-3) (preferably 4-6:1:1-2:1-2) are mixed, homogeneously ground and melted (preferably melted in a crucible), and a crystal is grown either on the surface of the high temperature melt or in the melt.

According to the invention, the conditions for crystal growth are described as follows. cooling rate: 0.1° C.-5° C./day, preferably 0.2° C.-1° C./day; rotational speed: 0-50 rpm (revolutions per minute), preferably 10-40 rpm; and rotational direction: unidirectional or bidirectional rotation (e.g. reversible bidirectional rotation).

According to the invention, after the crystal is grown to a desired size, seed crystal rod is lifted so that the crystal is separated from the surface of the liquid, cooled to room temperature at a rate of no more than 100° C./h (preferably less than 50° C./h), and a $Li_4Sr(BO_3)_2$ nonlinear optical crystal is obtained.

(5) The preparation method according to (3) or (4), wherein the flux agent is $Li_2O$ or $Li_2O$—$B_2O_3$, comprises the following steps: $Li_2O$, SrO and $B_2O_3$, with a molar ratio of 4-8:1:1-3 (equivalent to a molar ratio of $Li_4Sr(BO_3)_2$:$Li_2O$:$B_2O_3$=1:2-6:0-2) (preferably 4-7:1:1-2) are mixed, homogeneously ground and melted (preferably melted in a crucible), and a crystal is grown either on the surface of the high temperature melt or in the melt.

The conditions are described as follows. cooling rate: 0.1° C.-5° C./day, preferably 0.2-1° C./day; rotational speed: 0-50 rpm, preferably 10-40 rpm; rotational direction: uni-directional or bidirectional rotation. After the crystal is grown to a desired size, seed crystal rod is lifted so that the crystal is separated from the surface of the liquid, cooled to room temperature at a rate of no more than 100° C./h (preferably less than 50° C./h), and a $Li_4Sr(BO_3)_2$ nonlinear optical crystal is obtained.

According to the invention, a part of $Li_2O$ or $Li_2O$—$B_2O_3$ also serves as the flux agent.

(6) The preparation method according to (3) or (4), wherein the flux agent is a flux agent system of $Li_2O$—$B_2O_3$—LiF, comprises the following steps: $Li_2O$, SrO, $B_2O_3$ and LiF with a molar ratio of 4-8:1:1-3:1-3 (equivalent to a molar ratio of $Li_4Sr(BO_3)_2$:$Li_2O$:$B_2O_3$=1:2-6:0-2:1-3) (preferably 4-6:1:1-2:1-2) are mixed, homogeneously ground and melted (preferably melted in a crucible), and a crystal is grown either on the surface of the high temperature melt or in the melt.

The conditions are described as follows. cooling rate: 0.1° C.-5° C./day, preferably 0.2-1° C./day; rotational speed: 0-50 rpm, preferably 10-40 rpm; rotational direction: uni-directional or bidirectional rotation. After the crystal is grown to a desired size, seed crystal rod is lifted so that the crystal is separated from the surface of the liquid, cooled to room temperature at a rate of no more than 100° C./h (preferably less than 50° C./h), and a $Li_4Sr(BO_3)_2$ nonlinear optical crystal is obtained.

According to the invention, a part of $Li_2O$—$B_2O_3$—LiF also serves as the flux agent.

(7) The preparation method according to (3) or (4), wherein the method further comprises the post-treatment of the $Li_4Sr(BO_3)_2$ nonlinear optical crystal: after the end of the crystal growth, the crystal is still remained in the crystal-growing furnace to be annealed so that it is cooled to room temperature at a rate of no more than 100° C./h (preferably less than 50° C./h).

(8) According to any of the above-mentioned preparation methods, wherein said $Li_2O$ is selected from the hydroxide or oxide or carbonate or nitrate or oxalate of lithium. Said SrO is selected from the hydroxide or oxide or carbonate or nitrate or oxalate of strontium. Said $B_2O_3$ is selected from boric acid or boron oxide.

(9) Use of the $Li_4Sr(BO_3)_2$ nonlinear optical crystal as described in (2) as a nonlinear optical device.

Preferably, the prepared nonlinear optical device comprises an apparatus that can lead at least one beam of incident electromagnetic radiation, after passing through at least one said $Li_4Sr(BO_3)_2$ nonlinear optical crystal, to produce at least one output radiation with a frequency different from the frequency of the incident electromagnetic radiation.

Preferably, said use includes the conversion of 532 nm laser to 266 nm ultraviolet laser by using the crystal.

According to crystallographic data of the crystals, crystal boules are orientated, cut according to the desired angle, thickness and section size, and the light pass surfaces thereof are polished to be used as nonlinear optical devices.

In the present invention, said $Li_2O$, SrO and $B_2O_3$ are expressed in the form of oxides, but they may come from sources such as the corresponding forms of oxides, hydroxides, carbonates, nitrates or oxalates, etc. Preferably, said $Li_2O$ comes from the hydroxide or oxide or carbonate or nitrate or oxalate of lithium. Said SrO comes from hydroxide or oxide or carbonate or nitrate or oxalate of strontium. Said $B_2O_3$ comes from boric acid or boron oxide.

The $Li_4Sr(BO_3)_2$ nonlinear optical crystal possesses advantages such as good physicochemical stabilities, not easy to deliquesce, moderate hardness, good mechanical properties, not easy to disintegrate, easy processing and easy to preserve, etc. Therefore the present invention further provides the use of the $Li_4Sr(BO_3)_2$ nonlinear optical crystal, wherein the crystal is used for preparing nonlinear optical devices.

According to the present invention, the $Li_4Sr(BO_3)_2$ compound, the nonlinear optical crystal, the preparation method and the use thereof have the following advantageous effects:

As to the growth of the $Li_4Sr(BO_3)_2$ nonlinear optical crystal, the crystal can easily grow large and is transparent without inclusion. The crystal has advantages such as faster growth, low cost, easy to achieve larger crystal, etc. In addition, the obtained $Li_4Sr(BO_3)_2$ nonlinear optical crystal has advantages such as a very short UV absorption cut-off edge, relatively high nonlinear optical effect, stable physicochemical properties, not easy to deliquesce, good mechanical properties, easy processing and easy to preserve, etc. The $Li_4Sr(BO_3)_2$ nonlinear optical crystal can be used for preparing nonlinear optical devices. The nonlinear optical devices prepared with the nonlinear optical crystal of the present invention can be used for several military and civil high technology fields, such as blinding laser weapons, optical disc recording, laser projected TV, optical computing and fiber-optic communication, etc.

Figure 1:
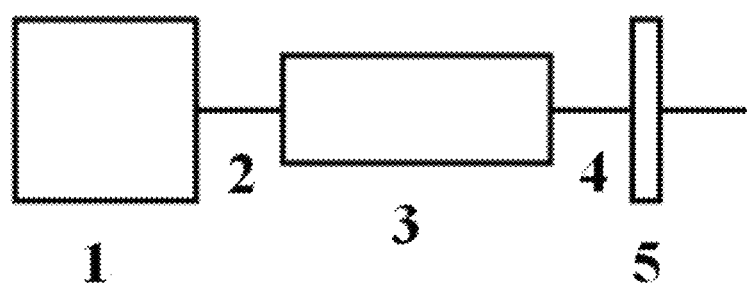
FIG. 1 is a diagram of the working principle of a typical nonlinear optical device made from the $Li_4Sr(BO_3)_2$ crystal.

The nonlinear optical device made from the $Li_4Sr(BO_3)_2$ crystal according to the present invention will be illustrated in detail with reference to FIG. 1 hereinafter. The light beam 2 emitted from the laser device 1 irradiated into the $Li_4Sr(BO_3)_2$ crystal 3. The generated light beam 4 passed through the optical filter 5 to obtain a desired laser beam. The nonlinear optical laser device can be a harmonic generator, an up/down frequency converter or an optical parametric oscillator, etc.

EMBODIMENTS

The present invention will be further illustrated with reference to the examples and drawings hereinbelow. A person skilled in the art should know that the following examples do not constitute a limitation of the protection scope of the present invention. Any improvement and modification made based on the present invention should be construed as being within the protection scope of the present invention.

Example 1

A $Li_4Sr(BO_3)_2$ crystal was grown in a flux agent system of $Li_2O$—$B_2O_3$ by flux method.

Figure 2:
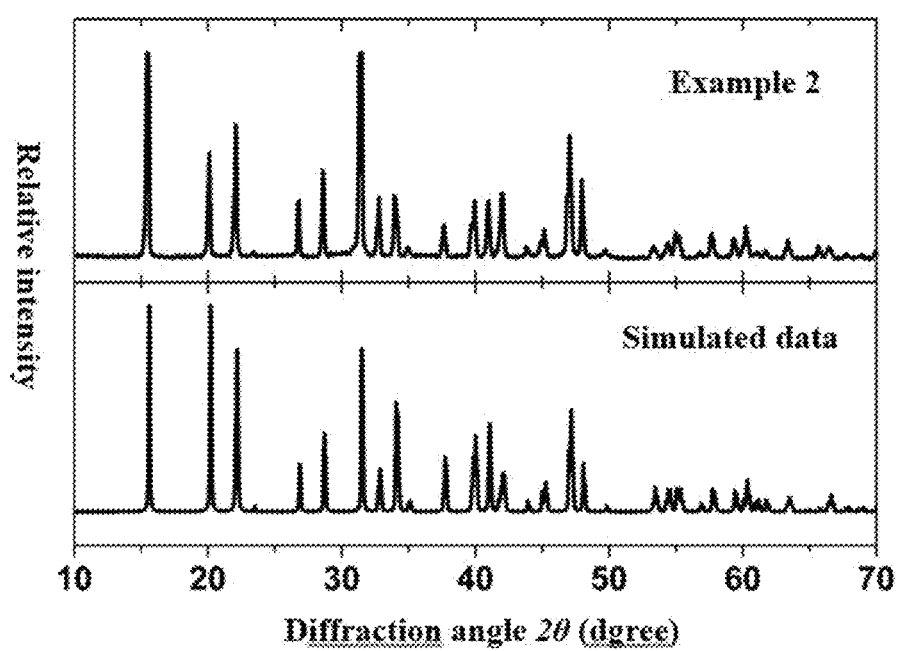
FIG. 2 shows the X-ray diffraction pattern of $Li_4Sr(BO_3)_2$ polycrystal powders according to the invention and the simulated X-ray diffraction pattern based on the crystal structure of the $Li_4Sr(BO_3)_2$ crystal.

Li$_2$CO$_3$, 49.2 g (0.333 mol) SrCO$_3$ and 61.8 g (1.000 mol) H$_3$BO$_3$ (wherein 1.500 mol Li$_2$CO$_3$ and 0.333 mol H$_3$BO$_3$ served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled to 550° C. at a rate of 20° C./day to precipitate Li$_4$Sr(BO$_3$)$_2$ crystals on the surface of the melt. Finally they were cooled to room temperature at a rate of 50° C./day. Transparent Li$_4$Sr(BO$_3$)$_2$ crystals were selected and subjected to powder X-ray diffraction analysis. The X-ray pattern was consistent with the simulated pattern based on the analysis result of single crystal X-ray diffraction, as shown in FIG. 2. Therefore, the obtained crystal was the Li$_4$Sr(BO$_3$)$_2$ crystal.

The part of relatively good quality was cut to give a seed crystal. The raw material was heated to melt again, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 25 rpm. The temperature was hold for half an hour, cooled down rapidly to the saturation temperature, and then cooled at a rate of 0.5° C./day. After the crystal is grown to a desired size, the seed crystal rod was lifted so that the crystal was separated from the surface of the liquid. The crystal remained in the furnace to be annealed so that it was cooled to room temperature at a rate of 30° C./h. A centimeter-grade Li$_4$Sr(BO$_3$)$_2$ crystal was thus obtained.

Example 2

A Li$_4$Sr(BO$_3$)$_2$ crystal was grown in a flux agent system of Li$_2$O—B$_2$O$_3$—LiF by flux method.

135.5 g (1.833 mol) Li$_2$CO$_3$, 49.2 g (0.333 mol) SrCO$_3$, 61.8 g H$_3$BO$_3$ (1.000 mol) and 8.6 g (0.333 mol) LiF (wherein 1.167 mol Li$_2$CO$_3$, 0.333 mol H$_3$BO$_3$ and 0.333 mol LiF served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 35 rpm. The temperature was hold for half an hour, cooled down rapidly to the saturation temperature, and then cooled at a rate of 0.8° C./day. After the crystal is grown to a desired size, the seed crystal rod was lifted so that the crystal was separated from the surface of the liquid. The crystal was still remained in the furnace to be annealed so that it was cooled to room temperature at a rate of 25° C./h. A centimeter-grade Li$_4$Sr(BO$_3$)$_2$ crystal was thus obtained.

Example 3

A Li$_4$Sr(BO$_3$)$_2$ crystal was grown using Li$_2$O as a flux agent by flux method.

123.2 g (1.667 mol) Li$_2$CO$_3$, 49.2 g (0.333 mol) SrCO$_3$ and 41.2 g (0.667 mol) H$_3$BO$_3$ (wherein 1.000 mol Li$_2$CO$_3$ served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 40 rpm. The temperature was hold for half an hour, rapidly cooled down to the saturation temperature, and then cooled at a rate of 0.5° C./day. After the crystal is grown to a desired size, the seed crystal rod was lifted so that the crystal was separated from the surface of the liquid. The crystal was still remained in the furnace to be annealed so that it was cooled to room temperature at a rate of 35° C./h. A centimeter-grade Li$_4$Sr(BO$_3$)$_2$ crystal was thus obtained.

Example 4

A Li$_4$Sr(BO$_3$)$_2$ crystal was grown in a flux agent system of Li$_2$O—B$_2$O$_3$ by flux method.

129.3 g (1.75 mol) Li$_2$CO$_3$, 36.9 g (0.25 mol) SrCO$_3$ and 34.8 g (0.50 mol) B$_2$O$_3$ (wherein 1.83 mol Li$_2$CO$_3$, 0.25 mol B$_2$O$_3$ served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 30 rpm. The temperature was hold for half an hour, rapidly cooled down to the saturation temperature, and then cooled at a rate of 0.8° C./day. After the crystal is grown to a desired size, the seed crystal rod was lifted so that the crystal was separated from the surface of the liquid. The crystal was still remained in the furnace to be annealed so that it was cooled to room temperature at a rate of 30° C./h. A centimeter-grade Li$_4$Sr(BO$_3$)$_2$ crystal was thus obtained.

Example 5

A Li$_4$Sr(BO$_3$)$_2$ crystal was grown using Li$_2$O as a flux agent by flux method.

147.8 g (2.00 mol) Li$_2$CO$_3$, 51.8 g (0.5 mol) SrO and 61.8 g (1.00 mol) H$_3$BO$_3$ (wherein 1.00 mol Li$_2$CO$_3$ served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 30 rpm. The temperature was hold for half an hour, rapidly cooled down to the saturation temperature, and then cooled at a rate of 0.5° C./day. After the crystal is grown to a desired size, the seed crystal rod was lifted so that the crystal was separated from the surface of the liquid. The crystal was still remained in the furnace to be annealed so that it was cooled to room temperature at a rate of 30° C./h. A Li$_4$Sr(BO$_3$)$_2$ crystal was thus obtained.

Example 6

A Li$_4$Sr(BO$_3$)$_2$ crystal was grown in a flux agent system of Li$_2$O—B$_2$O$_3$—LiF by flux method.

140.1 g (1.375 mol) $Li_2C_2O_4$, 36.9 g (0.250 mol) $SrCO_3$, 46.4 g (0.750 mol) $H_3BO_3$ and 13.0 g (0.500 mol) LiF (wherein 0.875 mol $Li_2CO_3$, 0.250 mol $H_3BO_3$ and 0.500 mol LiF served as the flux agent) were weighed, mixed and homogeneously ground, and then batch fed into a Ø 60 mm×60 mm open crucible. The obtained mixture was melted in a muffle furnace at 750° C. Subsequently, it was heated rapidly to 750° C. in a vertical crystal growth furnace, hold at this temperature for 24 hours, and then cooled down rapidly to 10° C. above the saturation temperature. A seed crystal rod fitted with the seed crystal was slowly inserted into the melt in the crucible, and the rotation unit at the top of the seed crystal rod was started with a rotation speed of 20 rpm. The temperature was hold for half an hour, rapidly cooled down to the saturation temperature, and then cooled at a rate of 0.5° C./day. After the crystal is grown to a desired size, the seed crystal rod was lifted so that the crystal was separated from the surface of the liquid. The crystal was still remained in the furnace to be annealed so that it was cooled to room temperature at a rate of 20° C./h. A $Li_4Sr(BO_3)_2$ crystal was thus obtained.

By using any of the three above-mentioned flux agents, the centimeter-grade $Li_4Sr(BO_3)_2$ nonlinear optical crystal can be obtained. Furthermore, by using large size crucible and prolonging the growth period, a $Li_4Sr(BO_3)_2$ nonlinear optical crystal with corresponding relative large size could be obtained.

Figure 3:
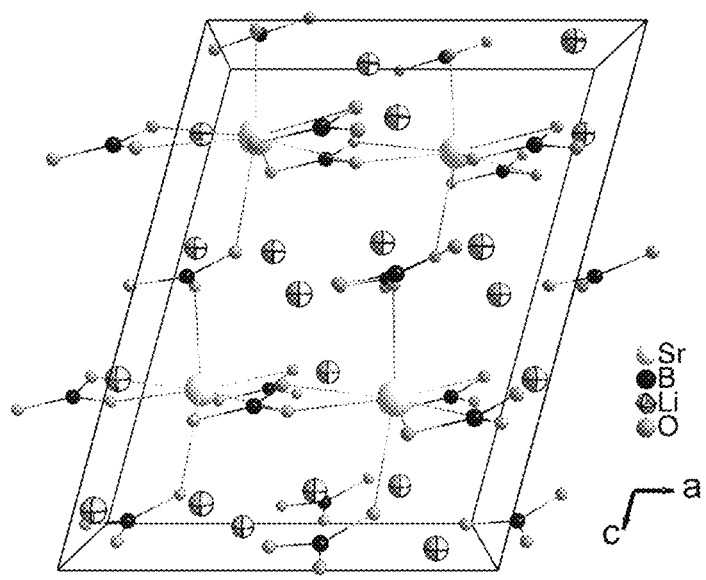
FIG. 3 is a diagram of the crystal structure of the $Li_4Sr(BO_3)_2$ according to the invention, wherein 1 is a laser device, 2 is an incident laser beam, 3 is a $Li_4Sr(BO_3)_2$ crystal subjected to crystal post-treatment and optical processing, 4 is the generated laser beam, and 5 is a optical filter.

According to the single-crystal X-ray diffraction analysis, the $Li_4Sr(BO_3)_2$ crystals prepared in the above Example 1-6 did not contain symmetric center and belong to monoclinic space group $C_c$ with lattice parameters of $\alpha$=9.117(5) Å, b=5.239(2) Å, c=11.762(6) Å, $\beta$=105.22(1)°, V=542.08 (127) Å$^3$ and Z=4. FIG. 3 shows the schematic crystal structure of the $Li_4Sr(BO_3)_2$ crystal.

Example 7

The $Li_4Sr(BO_3)_2$ nonlinear optical crystal obtained in Example 1 was subjected to a transmittance spectra test. The crystal had an UV absorption cut-off edge less than 190 nm and was transmissive within the wavelength range of 190-2500 nm. The crystal was not easy to crack but was easy to cut, polishing processing, preserve and was not easy to disintegrate. The $Li_4Sr(BO_3)_2$ nonlinear optical crystal obtained in Example 1 was placed in the equipment at the position 3 as shown in FIG. 1. At room temperature, when the Q-switched Nd:YAG laser was adopted as the fundamental frequency light source and a near-infrared light with a wavelength of 1064 nm was used as the incident light, the output light was a 532 nm green laser, with a laser intensity of about equivalent to two times that of KDP ($KH_2PO_4$). Moreover, the $Li_4Sr(BO_3)_2$ nonlinear optical crystal obtained in Example 2 was placed in the equipment at the position 3 as shown in FIG. 1. At room temperature, when a green laser with a wavelength of 532 nm was adopted as the fundamental frequency light source and a 532 nm green laser was used as the incident light, the output light was a 266 nm green laser, with a laser intensity of about equivalent to ¼ of that of BBO.

The invention claimed is:

1. A compound having a chemical formula of $Li_4Sr(BO_3)_2$.

2. A nonlinear optical crystal of a $Li_4Sr(BO_3)_2$ compound according to claim 1, wherein the crystal does not contain symmetric center and belongs to monoclinic space group $C_c$ with lattice parameters of a=9.117(5) Å, b=5.239(2) Å, c=11.762(6) Å, $\beta$=105.22(1)°, V=542.08 (127) Å$^3$, and Z=4.

3. A preparation method of a $Li_4Sr(BO_3)_2$ nonlinear optical crystal according to claim 2, wherein the growth of the $Li_4Sr(BO_3)_2$ nonlinear optical crystal is carried out by flux method, and the flux agent is chosen from $Li_2O$, $Li_2O$—$B_2O_3$, or $Li_2O$—$B_2O_3$—LiF.

4. The preparation method according to claim 3, comprising:
mixing $Li_2O$, SrO and $B_2O_3$ at a molar ratio of 4-8:1:1-3 (equivalent to a molar ratio of $Li_4Sr(BO_3)_2$:$Li_2O$:$B_2O_3$=1:2-6:0-2), or $Li_2O$, SrO, $B_2O_3$ and LiF at a molar ratio of 4-8:1:1-3:1-3 (equivalent to a molar ratio, $Li_4Sr(BO_3)_2$:$Li_2O$:$B_2O_3$:LiF=1:2-6:0-2:1-3), grounding and melting the mixture to form a melt, and growing a crystal on the surface of or inside the melt.

5. The preparation method according to claim 3, wherein the flux agent is $Li_2O$ or $Li_2O$—$B_2O_3$, comprising:
mixing $Li_2O$, SrO, and $B_2O_3$ at a molar ratio of 4-8:1:1-3 (equivalent to a molar ratio of $Li_4Sr(BO_3)_2$:$Li_2O$:$B_2O_3$=1:2-6:0-2), grounding and melting the mixture to form a melt, and growing a crystal on the surface of or inside the melt.

6. The preparation method according to claim 3, wherein the flux agent is a flux agent system of $Li_2O$—$B_2O_3$—LiF, comprising:
mixing $Li_2O$, SrO, $B_2O_3$ and LiF at a molar ratio of 4-8:1:1-3:1-3 (equivalent to a molar ratio of $Li_4Sr(BO_3)_2$:$Li_2O$:$B_2O_3$:LiF=1:2-6:0-2:1-3), homogeneously grounding and melting the mixture, and growing a crystal on the surface of or inside the melt.

7. The preparation method according to claim 3, further comprising annealing the crystal to room temperature at a rate of no more than 100° C./h.

8. The preparation method according to claim 1, wherein said $Li_2O$ is a hydroxide, an oxide, a carbonate, a nitrate, or an oxalate of lithium, said SrO is a hydroxide oxide, a carbonate, a nitrate, or an oxalate of strontium, and said $B_2O_3$ is boric acid or boron oxide.

9. A nonlinear optical device comprising a $Li_4Sr(BO_3)_2$ nonlinear optical crystal according to claim 2.

10. The preparation method according to claim 4, wherein the crystal grows at a cooling rate of 0.1° C.-5° C./day, a rotational speed of 0-50 rpm, and under unidirectional or bidirectional rotations.

11. The preparation method according to claim 4, wherein, when the crystal is grown to a predetermined size, lifting the crystal from the melt, cooling the crystal to room temperature at a rate of no more than 100° C./h to obtain the $Li_4Sr(BO_3)_2$ nonlinear optical crystal.

12. The preparation method according to claim 4, wherein the molar ratio of $Li_2O$:SrO:$B_2O_3$ is 4-7:1:1-2.

13. The preparation method according to claim 4, wherein the molar ratio of $Li_2O$:SrO:$B_2O_3$:LiF is 4-6:1:1-2:1-2.

14. The preparation method according to claim 5, wherein the molar ratio of $Li_2O$:SrO:$B_2O_3$ is 4-7:1:1-2.

15. The preparation method according to claim 6, wherein the molar ratio of $Li_2O$:SrO:$B_2O_3$:LiF is 4-6:1:1-2:1-2.

16. The preparation method according to claim 11, wherein the cooling rate is no more than 50° C./h.

* * * * *